United States Patent
Bybell (10) Patent No.: US 7,334,060 B2
(45) Date of Patent: Feb. 19, 2008

(54) SYSTEM AND METHOD FOR INCREASING THE SPEED OF SERIALLY INPUTTING DATA INTO A JTAG-COMPLIANT DEVICE

(75) Inventor: Anthony Joseph Bybell, Carrboro, NC (US)

(73) Assignee: International Business Machines Corporation, Armonk, NY (US)

( * ) Notice: Subject to any disclaimer, the term of this patent is extended or adjusted under 35 U.S.C. 154(b) by 697 days.

(21) Appl. No.: 10/805,151

(22) Filed: Mar. 19, 2004

(65) Prior Publication Data

US 2005/0210345 A1    Sep. 22, 2005

(51) Int. Cl.
*G06F 3/00* (2006.01)
*G06F 13/00* (2006.01)
*G01V 1/40* (2006.01)

(52) U.S. Cl. ............... 710/35; 710/2; 710/36; 710/52; 710/62; 702/108

(58) Field of Classification Search .............. None

See application file for complete search history.

(56) References Cited

U.S. PATENT DOCUMENTS

| | | | |
|---|---|---|---|
| 6,934,898 B1 * | 8/2005 | Goff | 714/727 |
| 6,947,884 B2 * | 9/2005 | Swoboda | 703/28 |
| 2005/0166106 A1 * | 7/2005 | Warren | 714/724 |

OTHER PUBLICATIONS

IEEE Standard Test Access Port and Boundary-Scan Architecture (IEEE 1149.1), 1 page attachment, Fig. 5-1.*

* cited by examiner

*Primary Examiner*—Alan S. Chen
(74) *Attorney, Agent, or Firm*—Van Leeuwen & Van Leeuwen; Jascelyn G. Cockburn (57) ABSTRACT

A JTAG-compliant device is configured to receive data through the control (TMS) line in addition to being configured to receive data through the input (TDI) line. A burst-write instruction is made the active instruction, extending the capability of the test access protocol (TAP) controller such that the TAP controller can receive data into a data register while the TAP controller is in certain states. In some states, the TAP controller receives and stores a bit only from the input line. In other states, the TAP controller receives and stores a bit from the input line, and in addition, the TAP controller receives and stores a bit from the control line. The TAP controller may store the received bits by shifting the received bits into the least significant bit of a data register.

18 Claims, 9 Drawing Sheets

SYSTEM AND METHOD FOR INCREASING THE SPEED OF SERIALLY INPUTTING DATA INTO A JTAG-COMPLIANT DEVICE

BACKGROUND OF THE INVENTION

1. Technical Field

The present invention relates in general to a system and method for increasing the speed of serially inputting data into a JTAG-compliant device. In particular, the present invention relates to a system and a method for inputting data into the device through the control (TMS) line as well as through the data input (TDI) line.

2. Description of the Related Art

Joint Test Action Group (JTAG), or IEEE Standard 1149.1, is a standard specifying how to identify, control, test, and monitor JTAG-compliant devices (such as microprocessors, memory, etc.) on a printed circuit board. Each JTAG-compliant device, in addition to the device's own communication lines, has five additional lines for supporting the JTAG protocol. The lines include a clock (TCK) line, a control (TMS) line for controlling the operation of the device's JTAG-related components, and a common reset (TRST) for resetting the JTAG-portion of the device. In addition, the lines include a data input (TDI) line for serially inputting data into the device and an output data (TDO) line for daisy chaining one device's data output to another's data input.

Internally, a JTAG-compliant device contains a test access protocol (TAP) controller, a state machine whose state is controlled by the signal received on the control (TMS) line. By traversing the different states of the test access protocol (TAP) controller, data can be loaded into and read from internal data and instruction registers, typically for the purpose of determining the proper operation of the device. For example, an instruction can be loaded, followed by data which is processed according to the loaded instruction. For more details on the JTAG-IEEE 1149.1 specification, please refer to IEEE's website.

According to the JTAG specification, the inputting of data into the test access protocol (TAP) controller and the outputting of data out of the test access protocol (TAP) controller is limited to data on the input (TDI) and output (TDO) lines, respectively. Data on these lines flows at the rate of one bit every clock cycle. In cases where many JTAG operations are required and/or many JTAG-compliant devices exist on a printed circuit board, this limitation can significantly increase the time required to run tests or other JTAG-related procedures. Data compression techniques can be used in order to increase the data flow, but such approaches tend to be complex and difficult to implement.

What is needed, therefore, is a system and method that increases the rate at which data can be inputted into a JTAG-compliant device. The system and method should provide the capability to increase the data rate without significantly increasing complexity. At the same time, the operation of the device should remain within the IEEE JTAG protocol in order not to preclude testing of the device using other JTAG-compliant methods.

SUMMARY

It has been discovered that the aforementioned challenges are addressed by a method and system that enable the test access protocol (TAP) controller of a JTAG-compliant device to receive and store bits of data through the control (TMS) line in addition to the test access protocol (TAP) controller's ability to receive and store bits of data through the input (TDI) line.

A burst-write instruction is first made the active instruction of the test access protocol (TAP) controller of a JTAG-compliant device. The burst-write instruction is received through the input (TDI) line of the test access protocol (TAP) controller and is loaded into the instruction register of the test access protocol (TAP) controller. The burst-write instruction extends the capability of the test access protocol (TAP) controller such that the test access protocol (TAP) controller can receive data into a data register while the test access protocol (TAP) controller is in certain states.

In certain states, the test access protocol (TAP) controller receives and stores a bit of data through the input (TDI) line on a subsequent clock cycle in response to the burst-write instruction being the active instruction in the test access protocol (TAP) controller. At other states, the test access protocol (TAP) controller receives and stores a bit of data through the input (TDI) line, and in addition, the test access protocol (TAP) controller receives and stores a bit of data through the control (TMS) line on a subsequent clock cycle in response to the burst-write instruction being the active instruction in the test access protocol (TAP) controller. The test access protocol (TAP) controller stores the received bits by shifting the received bits into the least significant bit of a data register designated to receive data when the burst-write instruction is the active instruction. The received bits are shifted into the data register on the rising (IEEE compatible) or falling edge of the clock signal.

By inputting data through both the input (TDI) and control (TMS) lines, an increase in the data input speed of up to 50%, on average, can be achieved. When a low signal (0) is to be received on the control line, data can be received through both the control and the input lines increasing the data input rate by 100%. When a high signal (1) is to be received through the control line data is received only through the input line. Since, in general, there is an equal likelihood of receiving a low signal or a high signal, on average, there is a 50% increase in the rate of inputting data to the TAP controller.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following is intended to provide a detailed description of an example of the invention and should not be taken to be limiting of the invention itself. Rather, any number of variations may fall within the scope of the invention defined in the claims following the description.

Figure 1:
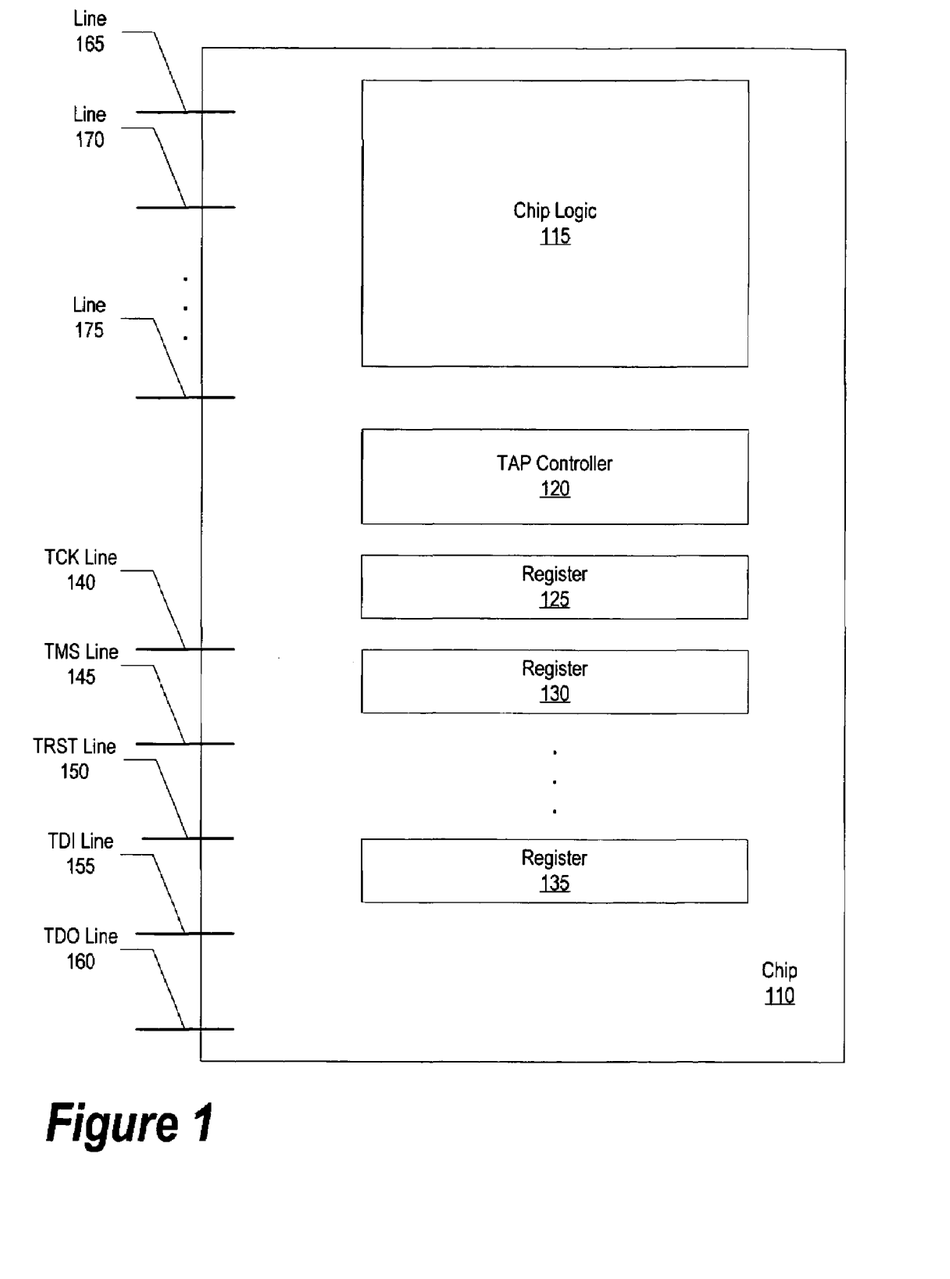
FIG. 1 is a block diagram illustrating a JTAG-compliant device configured to accept data through the control (TMS) and input (TDI) lines.

FIG. 1 is a block diagram illustrating a JTAG-compliant device configured to accept data through the device's input (TDI) line as well as through the device's control (TMS) line. In one embodiment, the JTAG-compliant device, such as chip 110, includes lines 165, 170, and 175, which are configured to input and output data to and from chip logic 115. Chip logic 115 is configured to perform the functions of chip 110, other than the chip's JTAG-related functions. For example, chip 110 may be a microprocessor configured to receive special instructions and process data accordingly, a memory configured to receive and store data, or a chip designed to perform any number of functions.

Chip 110 includes JTAG-related components such as Test Access Protocol (TAP) controller 120 and a number of registers such as registers 125, 130, and 135. Registers 125, 130, and 135 are configured to store instructions and data used during JTAG-related functions, such as testing of the device. Test access protocol (TAP) controller 120 is a state machine and is configured to control the operation of the JTAG portion of chip 110 and to provide the interface between JTAG components and other components on chip 110.

Lines 140-160 are configured to input and output data to and from test access protocol (TAP) controller 120. Line 140 (TCK) provides the synchronizing clock signal, line 145 (TMS) provides the control signal that controls the state of test access protocol (TAP) controller 120, line 150 common reset (TRST) provides a reset signal for resetting test access protocol (TAP) controller 120 to the controller's initial state, line 155 input (TDI) provides bit-by-bit serial data input to test access protocol (TAP) controller 120, and line 160 output (TDO) provides data output for daisy-chaining chip 110 to other JTAG-compliant devices. Test access protocol (TAP) controller 120 is configured to receive data through control (TMS) line 145 in addition to being configured to receive data through input (TDI) line 155 in order to increase the speed of data input to the test access protocol (TAP) controller.

Figure 2:
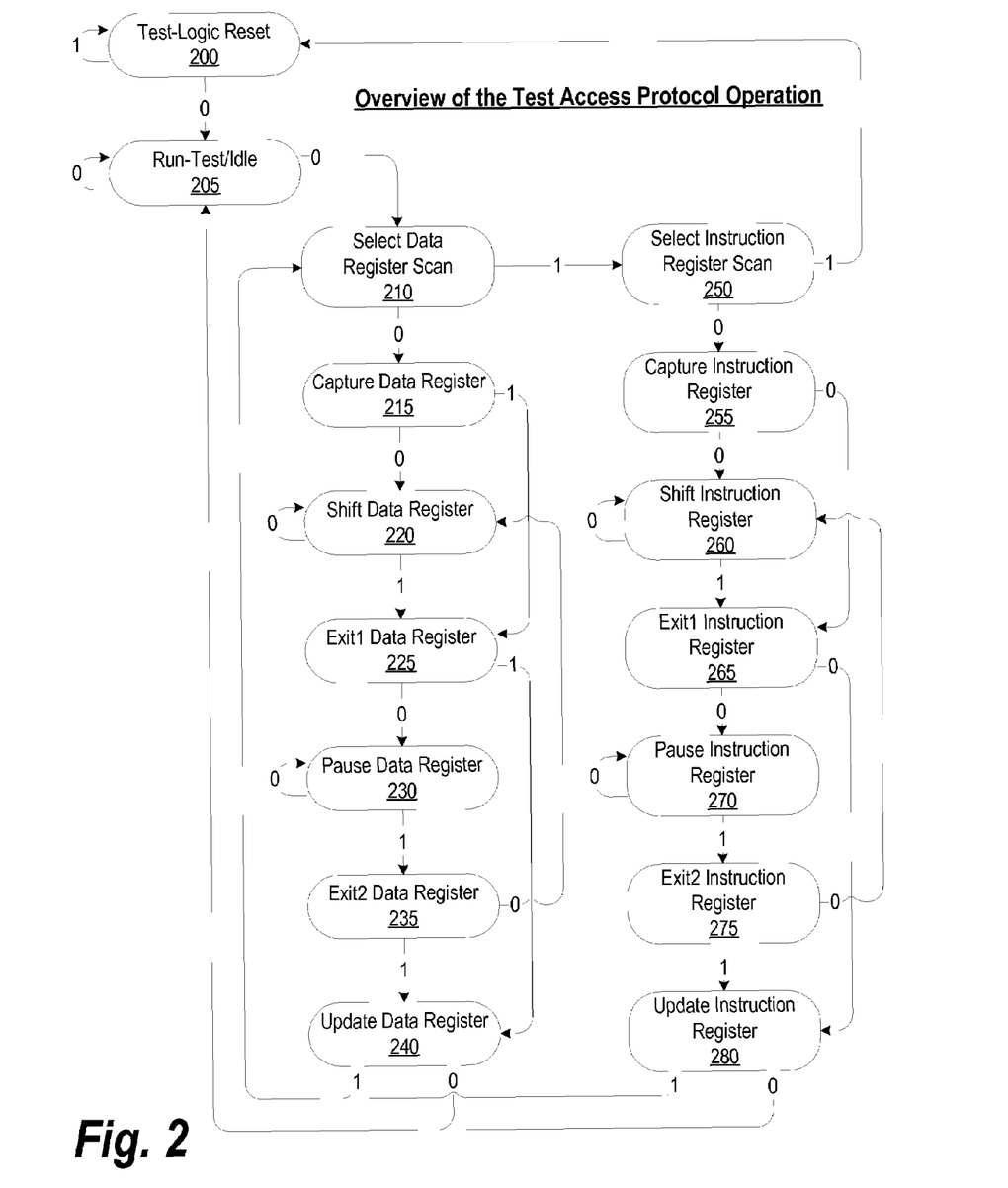
FIG. 2 is an overview of a logic state diagram illustrating the operation of the test access protocol (TAP) controller of a JTAG-compliant device.
Figure 3:
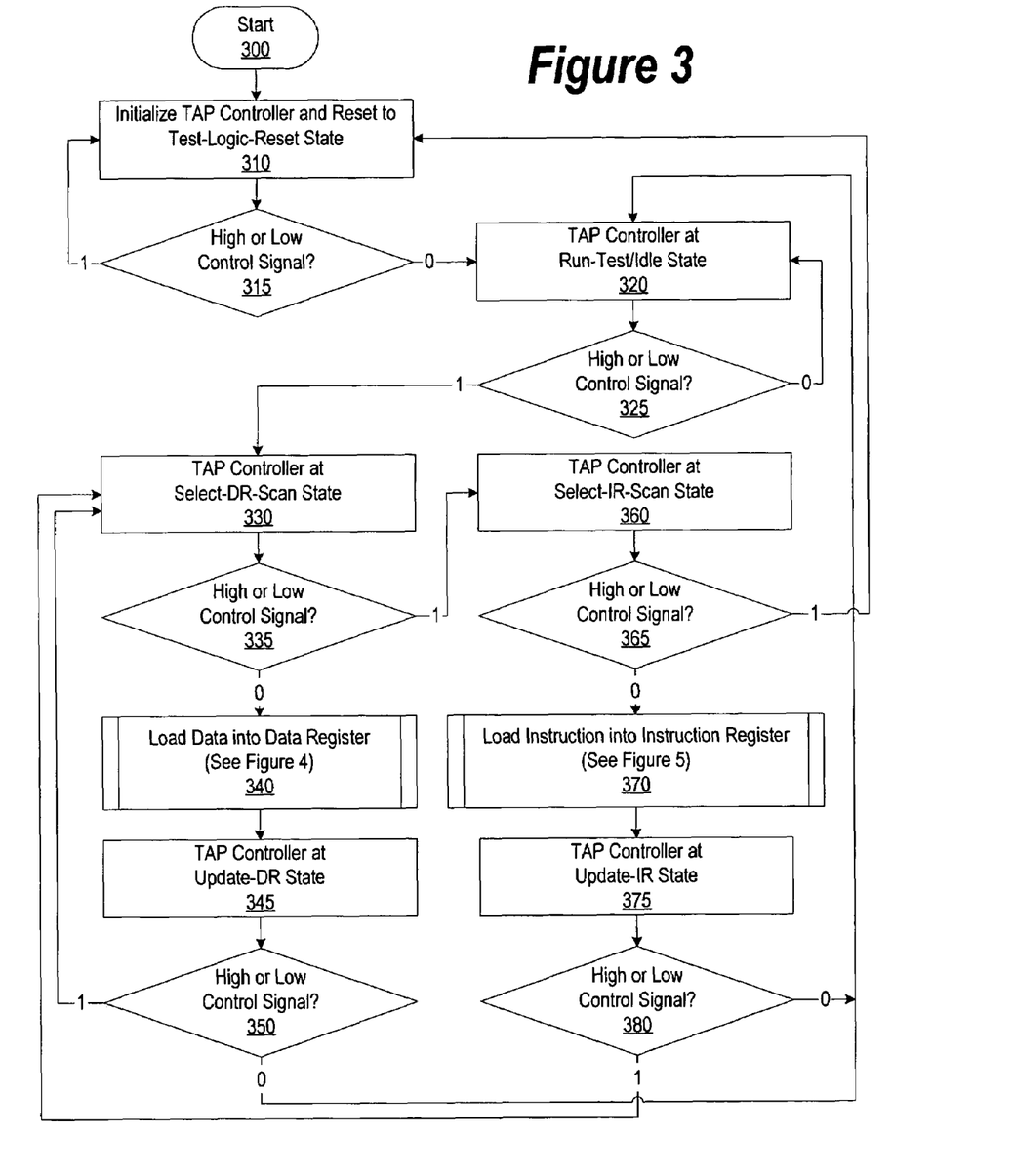
FIG. 3 is a flowchart illustrating a method for switching between the different states of a test access protocol (TAP) controller.

FIG. 2 is an overview of a logic state diagram illustrating the operation of the test access protocol (TAP) controller of a JTAG-compliant device. During initialization, the test access protocol (TAP) controller is placed at the Test-Logic-Reset state. The test access protocol (TAP) controller is configured to return to the Test-Logic-Reset state upon the test access protocol (TAP) controller's receiving of a reset signal (through the common reset (TRST) line). The changing of the state of the test access protocol (TAP) controller is controlled by the signal received through the control (TMS) line. The "0" and "1" arrows show how the state of the test access protocol (TAP) controller changes depending on whether the test access protocol (TAP) controller receives a low or high signal through the control line. The flowchart of FIG. 3 provides more details on the behavior of the TAP controller at the states: test-logic-reset 200, run-test/idle state 205, select-data-register-scan state 210, select-instruction-register-scan 250, update-data-register state 240, and update-instruction-register 280.

The test access protocol (TAP) controller's state diagram consists of two main branches: the data register (DR) branch where data are loaded into data registers and the instruction register (IR) branch where data are loaded into instruction registers.

Figure 4:
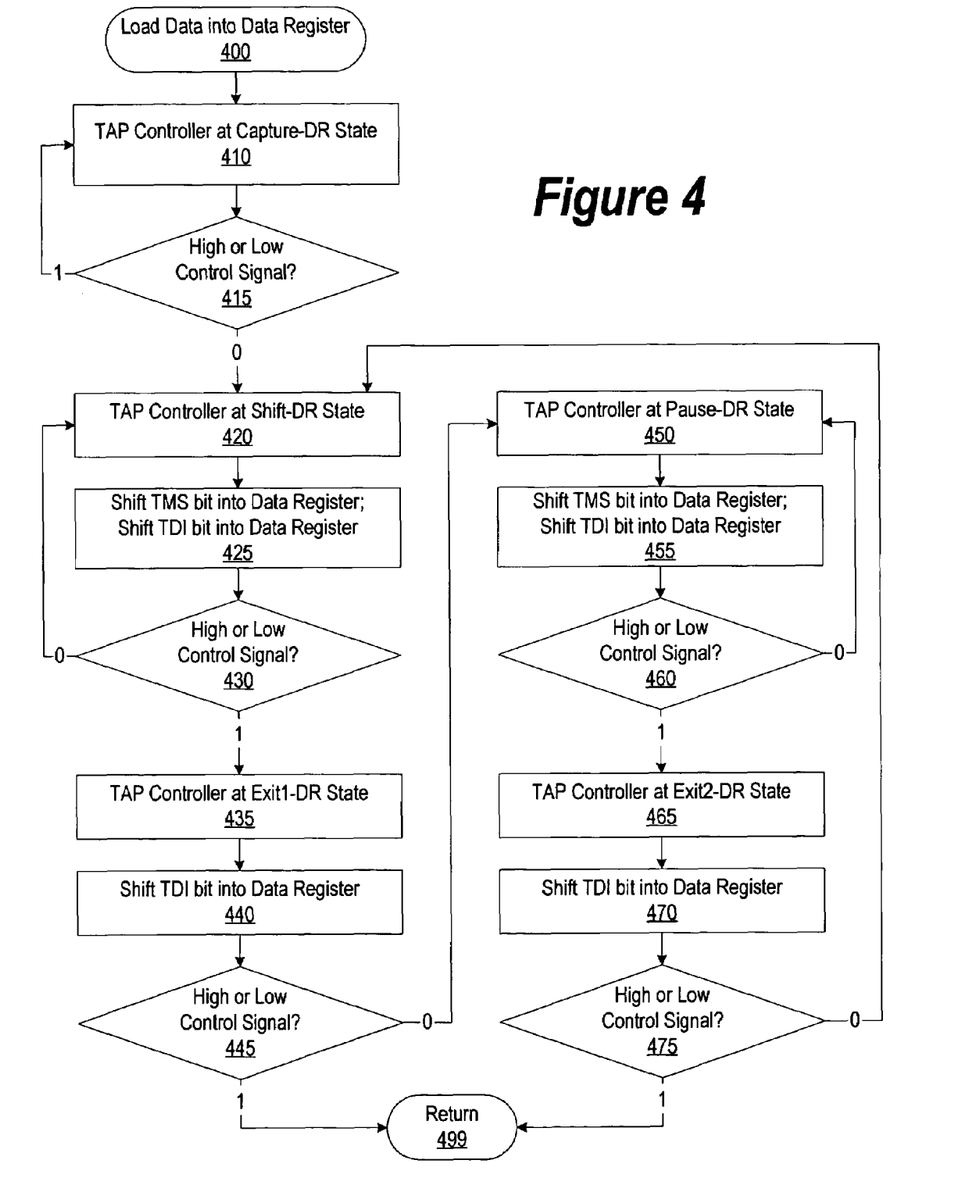
FIG. 4 is a flowchart illustrating a method for loading data into the data register of a test access protocol (TAP) controller.

More details on the operation of the test access protocol (TAP) controller and the behavior of the test access protocol (TAP) controller at the data register branch states (capture-data-register state 215, shift-data-register state 220, exit1-data-register state 225, pause-data-register 230, and exit2-data-register state 235) are provided in the flowchart of FIG. 4. In one embodiment, the test access protocol (TAP) controller is configured to receive data into a data register through the control (TMS) and input (TDI) lines when the controller is in Shift data register state 220 and Pause data register state 230 in response to a burst-write instruction being the active instruction in the test access protocol (TAP) controller. In addition, in one embodiment, the test access protocol (TAP) controller is configured to receive data into the data register through the input (TDI) line when the controller is in the Exit1 data register state 225 and Exit2 data register state 235 in response to the burst-write instruction being the active instruction in the test access protocol (TAP) controller.

Figure 5:
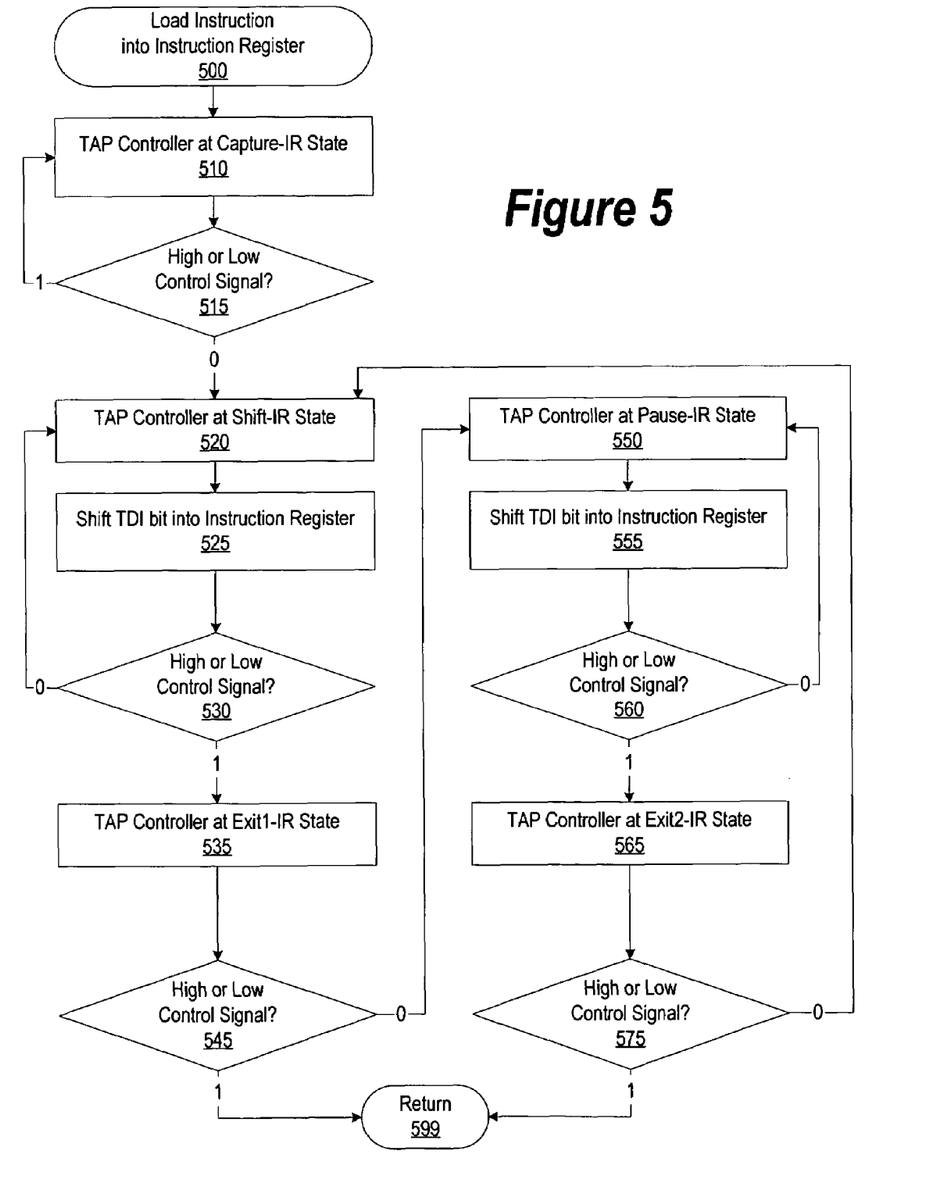
FIG. 5 is a flowchart illustrating a method for loading data into the instruction register of a test access protocol (TAP) controller.

More details on the operation of the test access protocol (TAP) controller and the behavior of the test access protocol (TAP) controller at the instruction register branch states (capture-instruction-register state 255, shift-instruction-register state 260, exit1-instruction-register state 265, pause-instruction-register 270, and exit2-instruction-register state 275) are provided in the flowchart of FIG. 5.

FIG. 3 is a flowchart illustrating a method for switching between the different states and thus controlling the operation of a test access protocol (TAP) controller. Processing begins at 300 whereupon, at step 310, the test access protocol (TAP) controller is initialized (powered-up) and reset to the test-logic-reset state. In one embodiment, the test access protocol (TAP) controller is placed in the test-logic-reset state during initialization of the system. The test access protocol (TAP) controller may also return to the test-logic-reset state when a reset signal is received through the test reset (TRST) line of the test access protocol (TAP) controller. A determination is then made as to whether a high or low signal is received on the control (TMS) line of the test access protocol (TAP) controller during the next clock cycle at decision 315.

If a high signal is received through the control (TMS) line, decision 315 branches to the "1" branch whereupon processing returns to step 310, and the test access protocol (TAP) controller remains in the test-logic-reset state. If a low signal is received through the control (TMS) line, decision 315 branches to the "0" branch whereupon, at step 320, the test access protocol (TAP) controller advances to the run-test/idle state. The run-test/idle state is a state between scan operations. In this state, the contents of all test data registers retain their previous value. When certain instructions are present, activity in selected test logic may occur. A determination is then made as to whether a high or low signal is received on the control (TMS) line of the test access protocol (TAP) controller during the next clock cycle at decision 325. If a low signal is received through the control (TMS) line, decision 325 branches to the "0" branch whereupon processing returns to step 320 where the test access protocol (TAP) controller remains at the run-test/idle state.

On the other hand, if a high signal is received through the control (TMS) line, decision 325 branches to the "1" branch whereupon, at step 330, the test access protocol (TAP) controller advances to the select data register scan (select-data-register scan) state. The select data register scan state is the first state in the data register branch of the test access protocol (TAP) controller. This is typically a temporary state where all registers selected by the active instruction retain their previous values. A determination is then made as to whether a high or low signal is received on the control (TMS) line of the test access protocol (TAP) controller during the next clock cycle at decision 335. If a low signal is received through the control (TMS) line, decision 335 branches to the "0" branch whereupon, at predefined process 340, data is loaded into the selected data register of the test access protocol (TAP) controller. More details on the processing that takes place during predefined process 340 are provided in the flowchart and corresponding text of FIG. 4.

Processing continues at step 345 where the test access protocol (TAP) controller advances to the update data register (update-data-register) state. At this state, data from the shift data registers are output in parallel to other test data registers. A determination is then made as to whether a high or low signal is received on the control (TMS) line of the test access protocol (TAP) controller during the next clock cycle at decision 350. If a high signal is received through the control (TMS) line, decision 350 branches to the "1" branch whereupon processing returns to step 330 and the test access protocol (TAP) controller returns to the select data register-scan state. If a low signal is received through the control (TMS) line, decision 350 branches to the "0" branch whereupon processing returns to step 320 and the test access protocol (TAP) controller returns to the run-test/idle state.

Returning to decision 335, if a high signal is received through the control (TMS) line, decision 335 branches to the "1" branch whereupon processing continues at step 360 where the test access protocol (TAP) controller advances to the select instruction register scan (select-instruction-register-scan) state. The select instruction register scan state is the first state in the instruction register branch of the test access protocol (TAP) controller. This is typically a temporary state where all registers selected by the active instruction retain their previous values. A determination is then made as to whether a high or low signal is received on the control (TMS) line of the test access protocol (TAP) controller during the next clock cycle at decision 365. If a high signal is received through the control (TMS) line, decision 365 branches to the "1" branch whereupon processing returns to step 310 where the test access protocol (TAP) controller returns to the test-logic-reset state.

On the other hand, if a low signal is received through the control (TMS) line, decision 365 branches to the "0" branch whereupon, at predefined process 370, instructions are loaded into the instruction register of the test access protocol (TAP) controller. More details on the processing that takes place at predefined process 370 are provided in the flowchart and corresponding text of FIG. 5.

After predefined process 370, processing continues at step 375 where the test access protocol (TAP) controller advances to the update instruction register (update-instruction-register) state. At this state, data from the shift instruction registers is output in parallel to the test instruction register and become the new active instruction. A determination is then made as to whether a high or low signal is received on the control (TMS) line of the test access protocol (TAP) controller during the next clock cycle at decision 380. If a high signal is received through the control (TMS) line, decision 380 branches to the "1" branch whereupon processing returns to step 330 where the test access protocol (TAP) controller returns to the select data register scan state. If a low signal is received through the control (TMS) line, decision 380 branches to the "0" branch whereupon processing returns to step 320 where the test access protocol (TAP) controller returns to the run-test/idle state.

FIG. 4 is a flowchart illustrating a method for loading data into the data register of a test access protocol (TAP) controller. Processing begins at 400 whereupon, at step 410, the test access protocol (TAP) controller advances to the capture data register state. In this state, data may be loaded in parallel into data registers selected by the active instruction. A determination is then made as to whether a high or low signal is received on the control (TMS) line of the test access protocol (TAP) controller during the next clock cycle at decision 415. If a high signal is received through the control (TMS) line, decision 415 branches to the "1" branch whereupon processing returns to step 410 where the test access protocol (TAP) controller remains at the capture data register state.

If a low signal is received through the control (TMS) line, decision 415 branches to the "0" branch whereupon the test access protocol (TAP) controller advances to the shift data register state at step 420. If a special opcode value has been placed in the instruction register, the test access protocol (TAP) controller is placed in burst-write mode. Data inputted through the input (TDI) line and data inputted through the control (TMS) line are shifted into a special "shadow" data register. In one embodiment, the shadow data register has alternate shift-in semantics in order to accept additional data from the control (TMS) line as will be described below. The shadow data register may have one additional bit compared to the other registers of the test access protocol (TAP) controller. For example, if the other registers are 32 bits long, the shadow data register may be 33 bits long. If the other registers are 128 bits long, the shadow data register may be 129 bits long, etc.

At the next clock cycle, at step 425, a bit from the control (TMS) signal is shifted into the least significant bit (LSB) of the shadow data register followed by a bit from the input (TDI) control (TMS) signal. A determination is then made as to whether a high or low signal is received on the control (TMS) line of the test access protocol (TAP) controller during the next clock cycle at decision 430. If a low signal is received through the control (TMS) line, decision 430 branches to the "0" branch whereupon processing returns to step 420 where the test access protocol (TAP) controller remains in the shift data register state and two more bits are shifted into the shadow data register as described above.

On the other hand, if a high signal is received through the control (TMS) line, decision 430 branches to the "1" branch whereupon, at step 435, the test access protocol (TAP) controller advances to the exit1 data register state. At step

440, a bit from the input (TDI) signal is shifted into the shadow data register. At this state, the control (TMS) bit is used to determine whether to exit or continue inputting data. The control (TMS) signal is not used for data input. A determination is made as to whether a high or low signal is received on the control (TMS) line of the test access protocol (TAP) controller during the next clock cycle at decision 445. If a high signal is received through the control (TMS) line, decision 445 branches to the "1" branch whereupon processing returns to the calling routine at 499.

On the other hand, if a low signal is received through the control (TMS) line, decision 445 branches to the "0" branch whereupon, at step 450, the test access protocol (TAP) controller advances to the pause data register state, a stage similar to the shift data register state. At step 455, a bit from the control (TMS) signal is shifted into the shadow data register followed by a bit from the input (TDI) signal. A determination is then made as to whether a high or low signal is received on the control (TMS) line of the test access protocol (TAP) controller during the next clock cycle at decision 460. If a low signal is received through the control (TMS) line, decision 460 branches to the "0" branch whereupon processing returns to step 450 where the test access protocol (TAP) controller remains in the pause data register state where two more bits can be shifted into the shadow data register from the control (TMS) and input (TDI) lines.

On the other hand, if a high signal is received through the control (TMS) line, decision 460 branches to the "1" branch whereupon, at step 465, the test access protocol (TAP) controller advances to the exit2 data register state, a state similar to the exit1 data register state. At step 470, a bit from the input (TDI) signal is shifted into the shadow data register. A determination is then made as to whether a high or low signal is received on the control (TMS) line of the test access protocol (TAP) controller during the next clock cycle at decision 475. If a high signal is received through the control (TMS) line, decision 475 branches to the "1" branch whereupon processing returns to the calling routine at 499.

If a low signal is received through the control (TMS) line, decision 475 branches to the "0" branch whereupon, at step 480, the test access protocol (TAP) controller returns to the shift data register state where two additional bits can be shifted into the shadow data register.

In an embodiment where a 33-bit-long shadow data register is being used, when 32 or 33 bits have been shifted into the data register, the 32 most significant (older) bits are output to another register/logic. If 33 bits have been shifted into the data register, one bit remains in the data register. Because the data input states cannot be exited immediately (as is the case under normal operation), it may be necessary to "pad" the data stream with some "junk" data in order to reach the exit1 data register state or exit2 data register state and exit the "data" branch of the test access protocol (TAP) controller.

FIG. 5 is a flowchart illustrating a method for loading data into the instruction register of a test access protocol (TAP) controller. Processing begins at 500 whereupon, at step 510, the test access protocol (TAP) controller advances to the capture instruction register state. In this state, data may be loaded in parallel into the instruction register. A determination is then made as to whether a high or low signal is received on the control (TMS) line of the test access protocol (TAP) controller during the next clock cycle at decision 515. If a high signal is received through the control (TMS) line, decision 515 branches to the "1" branch whereupon processing returns to step 510 where the test access protocol (TAP) controller remains at the capture instruction register state.

If a low signal is received through the control (TMS) line, decision 515 branches to the "0" branch whereupon the test access protocol (TAP) controller advances to the shift instruction register state at step 520. During the next clock cycle, at step 525, a bit from the input (TDI) signal is shifted into the LSB of the instruction register. A determination is then made as to whether a high or low signal is received on the control (TMS) line of the test access protocol (TAP) controller during the next clock cycle at decision 530. If a low signal is received through the control (TMS) line, decision 530 branches to the "0" branch whereupon processing returns to step 520 where the test access protocol (TAP) controller remains in the shift instruction register state where one more bit can be shifted into the instruction register as described above.

On the other hand, if a high signal is received through the control (TMS) line, decision 530 branches to the "1" branch whereupon, at step 535, the test access protocol (TAP) controller advances to the exit1 instruction register state. A determination is then made as to whether a high or low signal is received on the control (TMS) line of the test access protocol (TAP) controller during the next clock cycle at decision 545. If a high signal is received through the control (TMS) line, decision 545 branches to the "1" branch whereupon processing returns to the calling routine at 599.

On the other hand, if a low signal is received through the control (TMS) line, decision 545 branches to the "0" branch whereupon, at step 550, the test access protocol (TAP) controller advances to the pause instruction register state. A determination is then made as to whether a high or low signal is received on the control (TMS) line of the test access protocol (TAP) controller during the next clock cycle at decision 560. If a low signal is received through the control (TMS) line, decision 560 branches to the "0" branch whereupon processing returns to step 550 where the test access protocol (TAP) controller remains in the pause instruction register state.

On the other hand, if a high signal is received through the control (TMS) line, decision 560 branches to the "1" branch whereupon, at step 565, the test access protocol (TAP) controller advances to the exit2 instruction register state, a state similar to the exit1 instruction register state. A determination is then made as to whether a high or low signal is received on the control (TMS) line of the test access protocol (TAP) controller during the next clock cycle at decision 575. If a low signal is received through the control (TMS) line, decision 575 branches to the "0" branch whereupon, at step 520, the test access protocol (TAP) controller returns to the shift instruction register state where one additional bit can be shifted into the instruction register.

If a high signal is received through the control (TMS) line, decision 575 branches to the "1" branch whereupon processing returns to the calling routine at 599.

Figure 6:
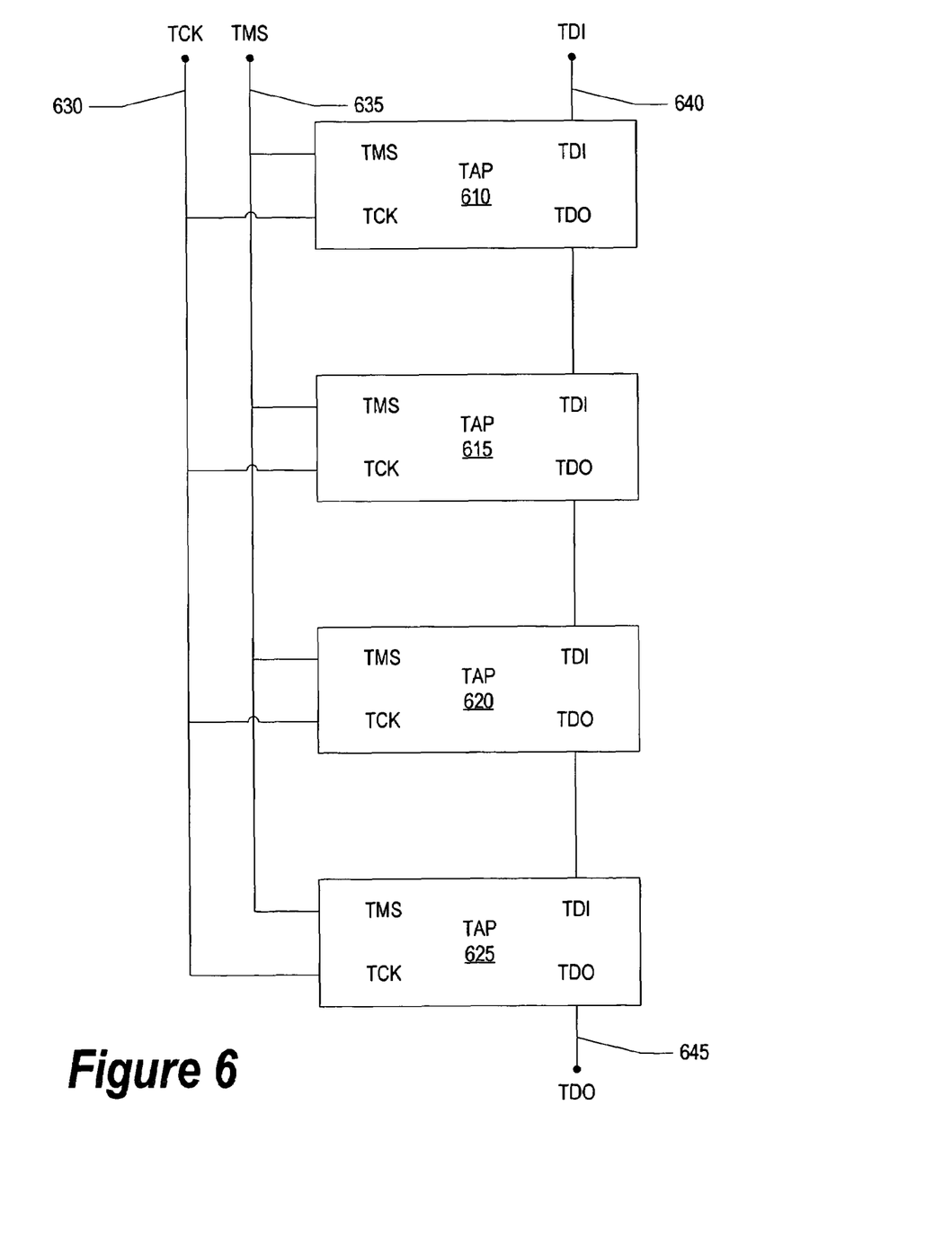
FIG. 6 is a block diagram illustrating a serial chain of test access protocol (TAP) controllers using one control (TMS) signal.

FIG. 6 is a block diagram illustrating a serial chain of test access protocol (TAP) controllers using one control (TMS) signal. Test access protocol (TAP) controllers 610, 615, 620, and 625 are connected in series to each other and are sharing clock signal (TCK) 630 and test mode select control (TMS) signal 635. The input signal is provided to the input (TDI) line 640 of the first test access protocol (TAP) controller (610), and from output (TDO) line 645 of the test access protocol (TAP) controller the signal is provided to the next test access protocol (TAP) controller in the chain, etc.

In this configuration, the control (TMS) and clock (TCK) signals are common between the test access protocol (TAP) controllers, and as such, the state of each test access protocol (TAP) controller is in lockstep. Burst-write mode can be used in this configuration since a "bypass" opcode in the instruction register keeps data register actions from having any effect on chips that have not been "selected."

Figure 7:
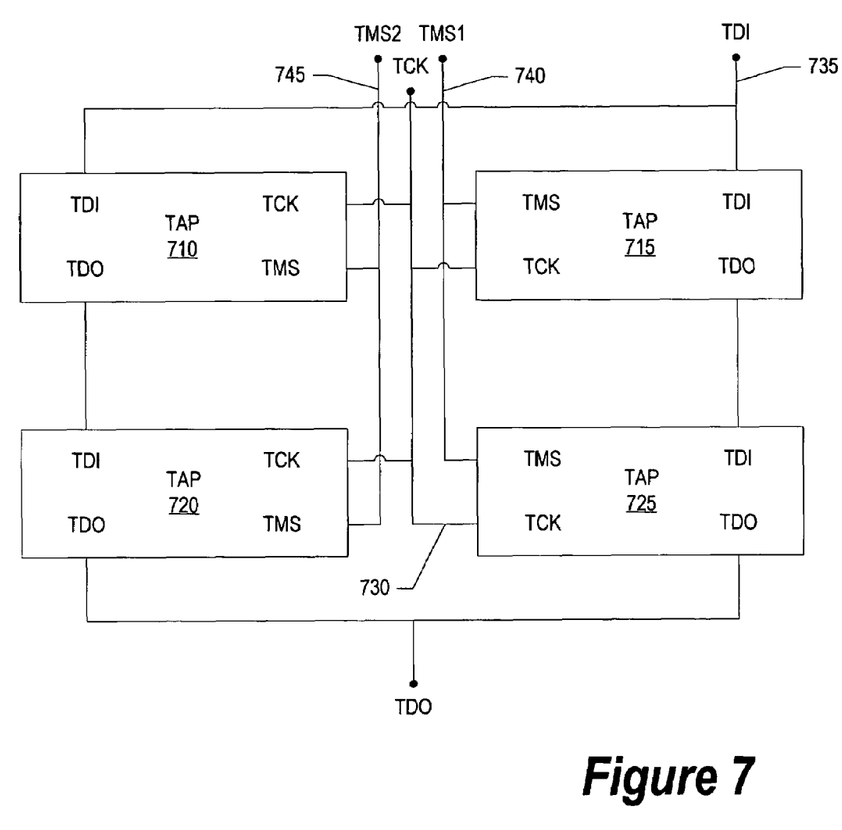
FIG. 7 is a block diagram illustrating two parallel serial chains of test access protocol (TAP) controllers.

FIG. 7 is a block diagram illustrating two parallel serial chains of test access protocol (TAP) controllers. Test access protocol (TAP) controller 715 is connected in series to test access protocol (TAP) controller 725, and TAP controller 710 is connected in parallel to test access protocol (TAP) controller 720. (Test access protocol (TAP) controller 715 and TAP controller 725) The first pair is connected in parallel to the second pair (Test access protocol (TAP) controller 710 and TAP controller 720.) The first and second controller pairs share clock 730 (TCK) and data input 735 (TDI) signals, but the first and second pairs each has its own control (TMS) signal (TMS1 740 used by the first pair and TMS2 745 used by the second pair.).

In this configuration, the TMS and clock (TCK) signals are common between all of the test access protocol (TAP) controllers. Since, at any time, only one serial chain is actively scanning, this configuration is equivalent to the serial configuration shown in FIG. 6. Burst-write mode can be used in this configuration since a "bypass" opcode in the instruction register keeps data register actions from having any effect on chips in the serial chain that have not been "selected".

Figure 8:
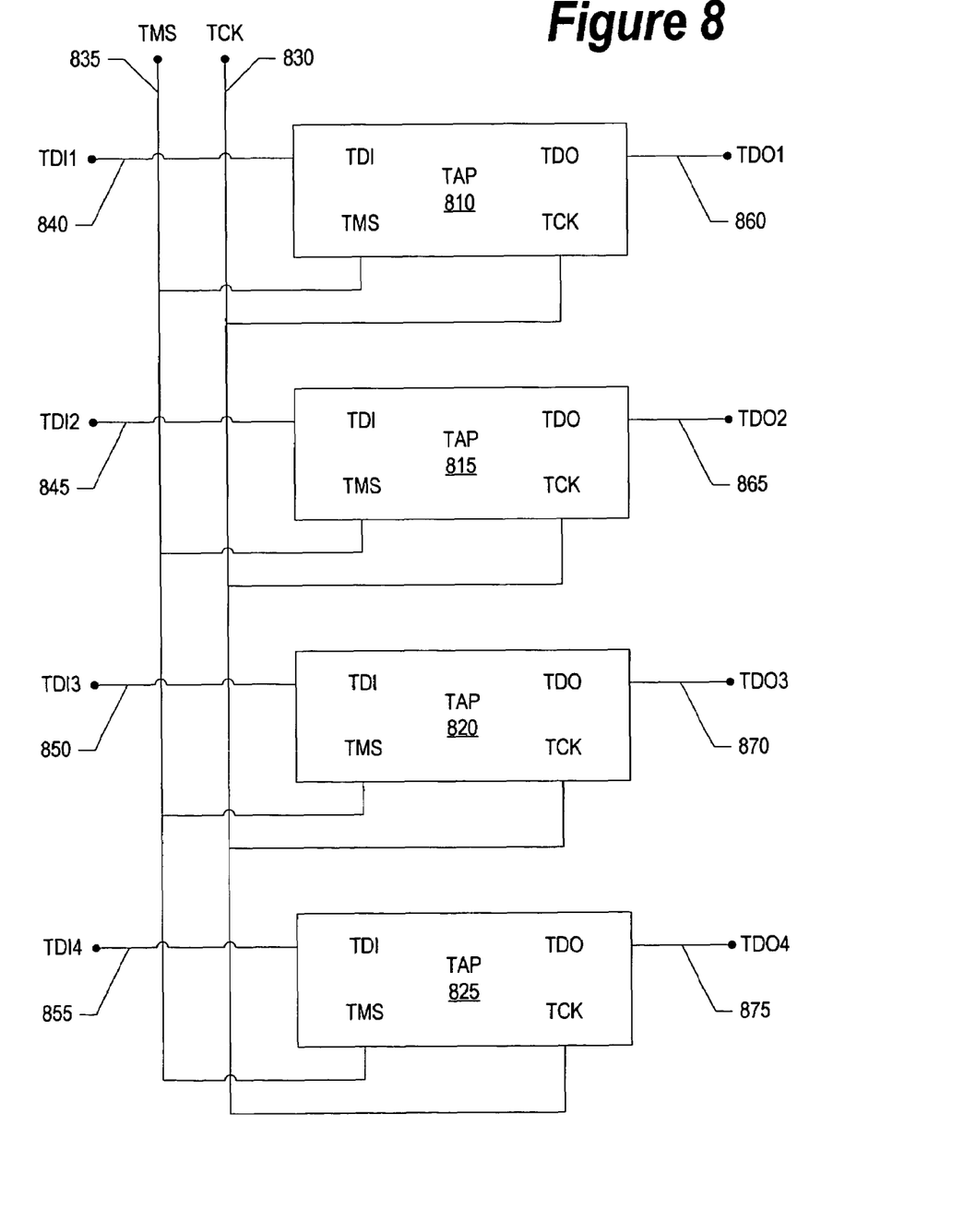
FIG. 8 is a block diagram illustrating a chain of test access protocol (TAP) controllers having multiple independent paths with common control (TMS) and clock (TCK) signals.

FIG. 8 is a block diagram illustrating a chain of test access protocol (TAP) controllers having multiple independent data paths with common control (TMS) and clock (TCK) signals. Test access protocol (TAP) controllers 810, 815, 820, and 825 are connected in parallel to each other. The test access protocol (TAP) controllers have common clock (TCK) signal 830 and common control (TMS) signal 835, but each of the test access protocol (TAP) controllers has a separate data input signal, TDI1 840, TDI2 845, TDI3 850, & TDI4 855, respectively. Each also has a separate data output signal TDO1 860, TDO2 865, TDO3 870, and TDO4 875, respectively. The output lines can be used to provide the input signals into the TAP controllers to additional TAP controllers that may be connected to the existing configuration of TAP controllers.

In this configuration, the test access protocol (TAP) controllers share common control (TMS) line 835. Thus, burst-mode would be possible when all the test access protocol (TAP) controllers are to receive the same data. The same signal is then sent on all of the input lines (TDI1 840, TDI2 845, TDI3 850, & TDI4 855). In this case, the system behaves similarly to the system shown in FIG. 6.

Figure 9:
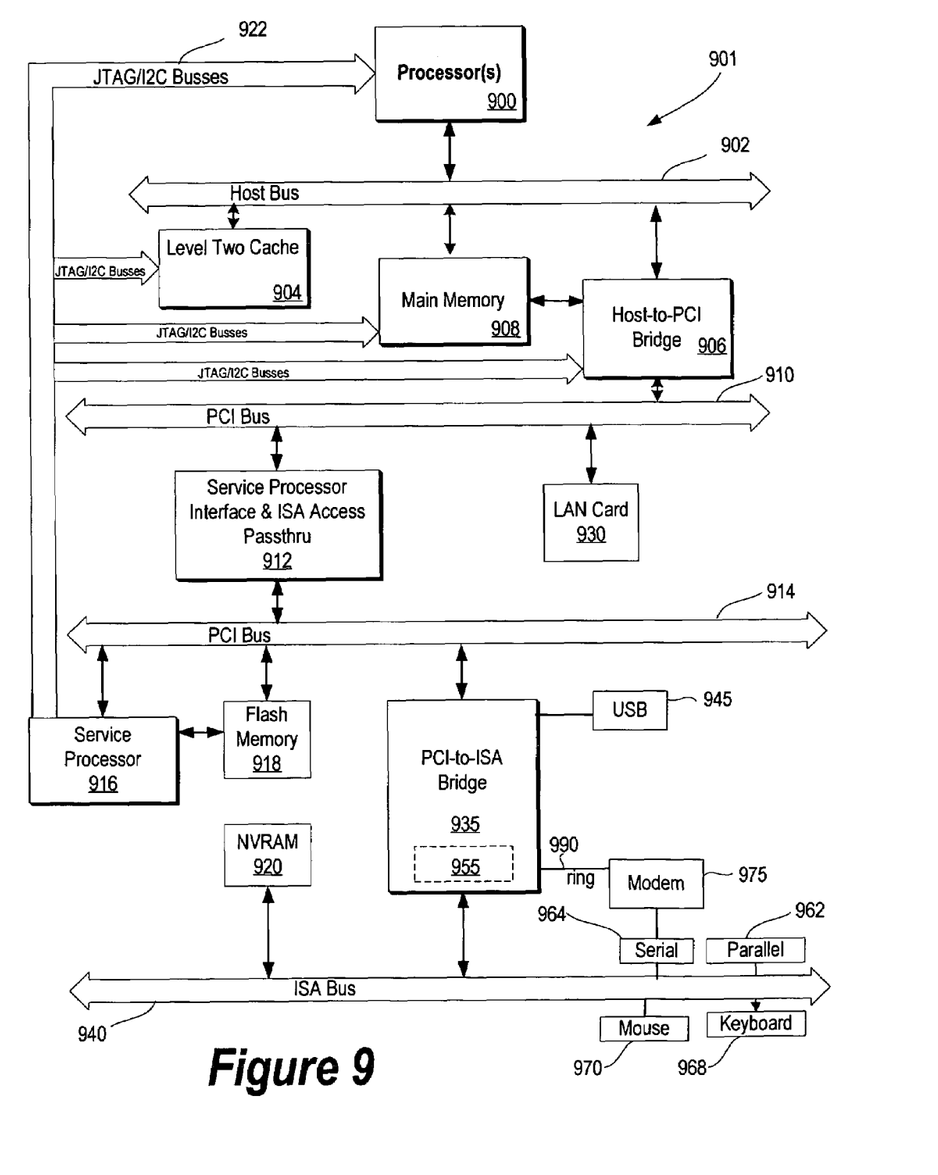
FIG. 9 illustrates an information handling system that is a simplified example of a computer system capable of performing the operations described herein.

FIG. 9 illustrates information handling system 901 which is a simplified example of a computer system capable of performing the computing operations described herein. Computer system 901 includes processor 900 which is coupled to host bus 902. A level two (L2) cache memory 904 is also coupled to host bus 902. Host-to-PCI bridge 906 is coupled to main memory 908, includes cache memory and main memory control functions, and provides bus control to handle transfers among PCI bus 910, processor 900, L2 cache 904, main memory 908, and host bus 902. Main memory 908 is coupled to Host-to-PCI bridge 906 as well as host bus 902. Devices used solely by host processor(s) 900, such as LAN card 930, are coupled to PCI bus 910. Service Processor Interface and ISA Access Pass-through 912 provides an interface between PCI bus 910 and PCI bus 914. In this manner, PCI bus 914 is insulated from PCI bus 910. Devices, such as flash memory 918, are coupled to PCI bus 914. In one implementation, flash memory 918 includes BIOS code that incorporates the necessary processor executable code for a variety of low-level system functions and system boot functions.

PCI bus 914 provides an interface for a variety of devices that are shared by host processor(s) 900 and Service Processor 916 including, for example, flash memory 918. PCI-to-ISA bridge 935 provides bus control to handle transfers between PCI bus 914 and ISA bus 940, universal serial bus (USB) functionality 945, power management functionality 955, and can include other functional elements not shown, such as a real-time clock (RTC), DMA control, interrupt support, and system management bus support. Nonvolatile RAM 920 is attached to ISA Bus 940. Service Processor 916 includes JTAG and I2C busses 922 for communication with processor(s) 900 during initialization steps. JTAG/I2C busses 922 are also coupled to L2 cache 904, Host-to-PCI bridge 906, and main memory 908 providing a communications path between the processor, the Service Processor, the L2 cache, the Host-to-PCI bridge, and the main memory. Service Processor 916 also has access to system power resources for powering down information handling device 901.

Peripheral devices and input/output (I/O) devices can be attached to various interfaces (e.g., parallel interface 962, serial interface 964, keyboard interface 968, and mouse interface 970 coupled to ISA bus 940. Alternatively, many I/O devices can be accommodated by a super I/O controller (not shown) attached to ISA bus 940.

In order to attach computer system 901 to another computer system to copy files over a network, LAN card 930 is coupled to PCI bus 910. Similarly, to connect computer system 901 to an ISP to connect to the Internet using a telephone line connection, modem 975 is connected to serial port 964 and PCI-to-ISA Bridge 935.

While the computer system described in FIG. 9 is capable of executing the processes described herein, this computer system is simply one example of a computer system. Those skilled in the art will appreciate that many other computer system designs are capable of performing the processes described herein.

One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method comprising:
   sending bits of data on an input line and on a control line of a test access protocol (TAP) controller of a JTAG-compliant device; and
   receiving and storing the bits of data from the input line and from the control line at the TAP controller in response to a burst-write instruction being an active instruction in the TAP controller.

2. The method of claim 1, wherein the receiving and storing are performed in response to the TAP controller being in a shift data register state or a pause data register state.

3. The method of claim 1, further comprising loading the burst-write instruction into an instruction register of the TAP controller.

4. The method of claim 1, further comprising receiving and storing bits in response to:
   the TAP controller being in an Exit1 data register state.

5. The method of claim 1, further comprising receiving and storing bits in response to:
   the TAP controller being in an Exit2 data register state.

6. The method of claim 1, wherein the storing the bits comprises shifting the bits into a least significant bit of a data register.

7. An apparatus comprising:
   a JTAG-compliant test access protocol (TAP) controller;
   a control (TMS) line connected to the TAP controller; and
   an input (TDI) line connected to the TAP controller,
   the control and input lines adapted to transmit data bits, and
   the TAP controller adapted to receive and store the data bits transmitted on the control and input lines in response to a burst-write instruction being an active instruction in the TAP controller.

8. The apparatus of claim 7, wherein the TAP controller is adapted to receive the data bits in response to the TAP controller being in a shift data register (Shift-data-register) state or a pause data register (Pause-data-register) state.

9. The apparatus of claim 7, further comprising a data register accessible by the TAP controller, the data register adapted to store the data bits received from the control line and from the input line.

10. The apparatus of claim 9, wherein the data register is adapted to store the data bits by shifting the data bits into a least significant bit of the data register.

11. The apparatus of claim 7, wherein the TAP controller is adapted to receive the data bits of in response to:
    the TAP controller being in an Exit1 data register state.

12. The apparatus of claim 7, wherein the TAP controller is adapted to receive the data bits of in response to:
    the TAP controller being in an Exit2 data register state.

13. A computer program product stored on a computer operable media, the computer program product comprising software code effective to:
    send bits of data on an input line and on a control line of a test access protocol (TAP) controller of a JTAG-compliant device; and
    receive and store the bits of data from the input line and from the control line at the TAP controller in response to a burst-write instruction being an active instruction in the TAP controller.

14. The computer program product of claim 13, wherein the software code effective to receive and store are each performed in response to the TAP controller being in a shift data register state or a pause data register state.

15. The computer program product of claim 13, further comprising software code effective to load the burst-write instruction into an instruction register of the TAP controller.

16. The computer program product of claim 13, further comprising software code effective to receive and store the data bits in response to:
    the TAP controller being in an Exit1 data register state.

17. The computer program product of claim 13, further comprising software code effective to receive and store the data bits in response to:
    the TAP controller being in an Exit2 data register state.

18. The computer program product of claim 13, wherein the software code effective to store the bits comprises software code effective to shift the bits into a least significant bit of a data register.

* * * * *